(12) United States Patent
Ha et al.

(10) Patent No.: US 9,741,776 B2
(45) Date of Patent: Aug. 22, 2017

(54) MANUFACTURING METHOD FOR ORGANIC LIGHT EMITTING DIODE DISPLAY AND ORGANIC LIGHT EMITTING DIODE DISPLAY USING THE SAME

(71) Applicant: Samsung Display Co., Ltd., Yongin-si (KR)

(72) Inventors: Jae Heung Ha, Suwon-si (KR); Yong Tack Kim, Yongin-si (KR); Jong Woo Kim, Gwangmyeong-si (KR); Ji Young Moon, Hwaseong-si (KR); Min Ho Oh, Suwon-si (KR); Seung Jae Lee, Seoul (KR); Yoon Hyeung Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/096,713

(22) Filed: Apr. 12, 2016

(65) Prior Publication Data
US 2017/0084677 A1 Mar. 23, 2017

(30) Foreign Application Priority Data
Sep. 18, 2015 (KR) .................. 10-2015-0132244

(51) Int. Cl.
*H01L 27/32* (2006.01)
(52) U.S. Cl.
CPC .... *H01L 27/3258* (2013.01); *H01L 2227/323* (2013.01)
(58) Field of Classification Search
CPC .................. H01L 27/3218; H01L 27/3258
See application file for complete search history.

(56) References Cited

U.S. PATENT DOCUMENTS

2007/0232005 A1* 10/2007 Maruyama ........ H01L 29/41733
  438/299
2012/0068182 A1* 3/2012 Yamanaka ............ H01L 21/268
  257/59

(Continued)

FOREIGN PATENT DOCUMENTS

KR  10-2013-0015142   2/2013
KR  10-2013-0039238   4/2013

(Continued)

OTHER PUBLICATIONS

Liu et al. Omnidirectional emission from top-emitting organic light-emitting devices with microstructured cavity. Optics Letters, vol. 37(2). pp. 124-126. Jan. 15, 2012.

(Continued)

*Primary Examiner* — Christine Enad
(74) *Attorney, Agent, or Firm* — H. C. Park & Associates, PLC

(57) ABSTRACT

A method for manufacturing an organic light emitting diode display includes forming a thin-film transistor on a substrate, forming a protection layer by using a deposition method on an entire surface of the substrate, and forming an organic light emitting element on the protection layer. Forming the protection layer includes forming a first protection layer, a surface thereof including a first wrinkle, and forming a second protection layer on the first protection layer, a surface thereof including a second wrinkle. A first modulus value of the first protection layer is less than a second modulus value of the second protection layer by at least 300 MPa.

16 Claims, 16 Drawing Sheets

(56) References Cited

U.S. PATENT DOCUMENTS

| | | | |
|---|---|---|---|
| 2013/0182205 A1* | 7/2013 | Hibayashi | G02B 5/201 |
| | | | 349/106 |
| 2014/0029267 A1 | 1/2014 | Moon et al. | |
| 2014/0117842 A1* | 5/2014 | Hanamura | H01L 27/322 |
| | | | 313/504 |
| 2015/0021339 A1* | 1/2015 | Felts | C23C 16/30 |
| | | | 220/626 |
| 2015/0236300 A1 | 8/2015 | Naraoka | |

FOREIGN PATENT DOCUMENTS

| | | |
|---|---|---|
| KR | 10-2015-0014053 | 2/2015 |
| KR | 10-2015-0052216 | 5/2015 |

OTHER PUBLICATIONS

Kim et al. Highly enhanced light extraction from surface plasmonic loss minimized organic light-emitting diodes. Advanced Materials, vol. 25(26), pp. 3571-3577. Apr. 12, 2013.

Koo et al. Light extraction from organic light-emitting diodes enhanced by spontaneously formed buckles. Nature Photonics, vol. 4(4). pp. 222-226. Feb. 21, 2010.

* cited by examiner

MANUFACTURING METHOD FOR ORGANIC LIGHT EMITTING DIODE DISPLAY AND ORGANIC LIGHT EMITTING DIODE DISPLAY USING THE SAME

CROSS-REFERENCE TO RELATED APPLICATION

This application claims priority from and the benefit of Korean Patent Application No. 10-2015-0132244, filed on Sep. 18, 2015, which is hereby incorporated by reference for all purposes as if fully set forth herein.

BACKGROUND

Field

Exemplary embodiments relate to a manufacturing method of an organic light emitting diode display and an organic light emitting diode display using the same.

Discussion of the Background

An organic light emitting diode (OLED) display may not utilize a separate light source, being a self-emissive type display device. An OLED display may be driven by a low operating voltage, implemented with a light and thin design, and have high quality characteristics, such as a wide viewing angle, high contrast, and a fast response speed.

In an OLED display, a color shift may occur in a lateral viewing angle of the OLED display, due to an emission angle of light generated in an organic light emitting element of the OLED display.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a manufacturing method of an organic light emitting diode display with reduced color shift generated in the lateral viewing angle, and an organic light emitting diode display using the same.

Additional aspects will be set forth in the detailed description which follows, and, in part, will be apparent from the disclosure, or may be learned by practice of the inventive concept.

According to an exemplary embodiment of the present invention, a method for manufacturing an organic light emitting diode display includes forming a thin-film transistor on a substrate, forming a protection layer by using a deposition method on an entire surface of the substrate, and forming an organic light emitting element on the protection layer. Forming the protection layer includes forming a first protection layer, a surface thereof including a first wrinkle, and forming a second protection layer on the first protection layer, a surface thereof including a second wrinkle. A first modulus value of the first protection layer is less than a second modulus value of the second protection layer by at least 300 MPa.

According to an exemplary embodiment of the present invention, an organic light emitting diode display includes a thin-film transistor disposed on a substrate, a protection layer disposed on the thin-film transistor, a first electrode disposed on the protection layer and electrically connected to the thin-film transistor, an organic emission layer disposed on the first electrode, and a second electrode disposed on the organic emission layer. The protection layer includes a first protection layer, a surface thereof including a first wrinkle, and a second protection layer disposed on the first protection layer, a surface thereof including a second wrinkle The first modulus value of the first protection layer is less than a second modulus value of the second protection layer by at least 300 MPa.

According to exemplary embodiments of the present invention, a wrinkle may be formed on a surface of the protection layer, and the organic light emitting element is formed thereon, such that the color shift may be prevented from being generated in the lateral viewing angle of the organic light emitting diode display. Further, the protection layer having the wrinkle may be formed by the deposition process, such that the yield of the manufacturing process may be significantly improved.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
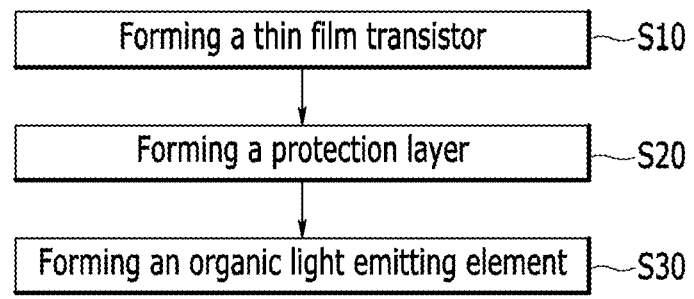
FIG. 1 is a process flowchart showing a manufacturing method of an organic light emitting diode display according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a process flowchart showing a manufacturing method of an organic light emitting diode display, according to an exemplary embodiment of the present invention.

Referring to FIG. 1, a manufacturing method of an organic light emitting diode (OLED) display according to an exemplary embodiment of the present invention includes a step of forming a thin-film transistor (S10), a step of forming a protection layer (S20), and a step of forming an organic light emitting element (S30).

In step S10, the thin-film transistor may be formed by using a method that is well known in the art. For example, a buffer layer, an insulating layer, etc., may be disposed on a substrate by using a deposition method, and an electrode layer may be patterned by using a photolithography process using a mask. In this case, the deposition method may use various methods, such as a plasma enhanced chemical vapor deposition (PECVD) method, an atmospheric pressure CVD (APCVD) method, a low pressure CVD (LPCVD) method, and the like. The structure of the thin-film transistor formed on the substrate will be described in more detail with reference to FIG. 4.

In step S20, a protection layer may be formed by using a deposition method on the entire substrate formed with the-thin film transistor. More particularly, a material forming a first protection layer is deposited with a first thickness on the entire surface of the substrate formed with the thin-film transistor, to form the first protection layer. A second protection layer is deposited on the first protection layer. The second protection layer has a modulus value greater than a modulus value of the first protection layer by at least 300 MPa, which may form a wrinkle on the surface of the protection layer. In this case, the second protection layer may have a larger modulus value than the first protection layer by 500 MPa or more, to easily form the wrinkle.

To this end, the first protection layer may include a material that may be controlled to have various modulus value, depending on the deposition condition. As used herein, the modulus value may be referred to as a value representing mechanical strength with reference to ISO527, JISK7161, JISK7162, JISK7127, ASTMD638, ASTMD882, etc. Accordingly, the low modulus value may refer to a higher flexibility.

When the first protection layer has a smaller modulus value than the second protection layer by at least 300 MPa, stress (a film stress) applied to the first protection layer and the second protection layer may be different from each other, and, thus, the wrinkle structure may be easily formed. Further, if the deposition conditions are properly controlled, a width of the wrinkle, a curve degree, etc., may also be easily controlled.

In conventional art, a separate photolithography process using a mask may be utilized to form a wrinkle structure on a protection layer. According to exemplary embodiments of the present invention, the first protection layer and the second protection layer are formed to have modulus values different from each other by a first value or more, thereby forming a wrinkle on the surface of the protection layer through the deposition process. In addition, since a separate process may not be utilized other than the deposition process, the step of forming the protection layer may be performed in one chamber, which may simplify the manufacturing processes.

According to an exemplary embodiment of the present invention, forming the protection layer may be include depositing a third protection layer on the entire surface of the substrate formed with the thin-film transistor, and sequentially depositing the first protection layer and the second protection layer thereon.

According to an exemplary embodiment of the present invention, forming the protection layer may include sequentially depositing a fourth protection layer and the second protection layer, after depositing the first protection layer on the entire surface of the substrate formed with the thin-film transistor. In this case, the fourth protection layer may include the same material as the first protection layer, and the fourth protection layer may be formed by hardening and depositing the first protection layer formation material. The hardening condition may be properly controlled, such that the first protection layer formation material may have the desired modulus value range. In this manner, when the fourth protection layer is formed after hardening the first protection layer formation material, the fourth protection layer may have a modulus value greater than the first protection layer by about 100 MPa to 200 MPa.

The step of forming the protection layer may further include surface-treating the first protection layer, which is deposited on the entire surface of the substrate formed with the thin-film transistor. That is, the second protection layer is deposited on the surface-treated first protection layer. The surface treatment may be performed by using at least one of $H_2$, $N_2$, $N_2O$, and combinations thereof. In this case, the duration of the surface treatment may be, for example, 5 to 100 seconds.

In step S30, the organic light emitting element may be formed by using a method that is well known in the art. For example, a pixel electrode, an organic emission layer, and a common electrode may be sequentially deposited on the protection layer having the wrinkle. The pixel electrode and the common electrode may be formed by using a sputtering method, a deposition method, or the like. The organic emission layer may be formed by using a printing method, such as inkjet printing or nozzle printing, or may be formed by using a mask, and the like.

As described above, according to exemplary embodiments of the present invention, the wrinkle is formed on the surface of the protection layer of the OLED display by a deposition process, without a separate mask process. In this manner, the protection layer may formed in one chamber, which may simply the manufacturing process and reduce costs associated therewith.

Figure 2:
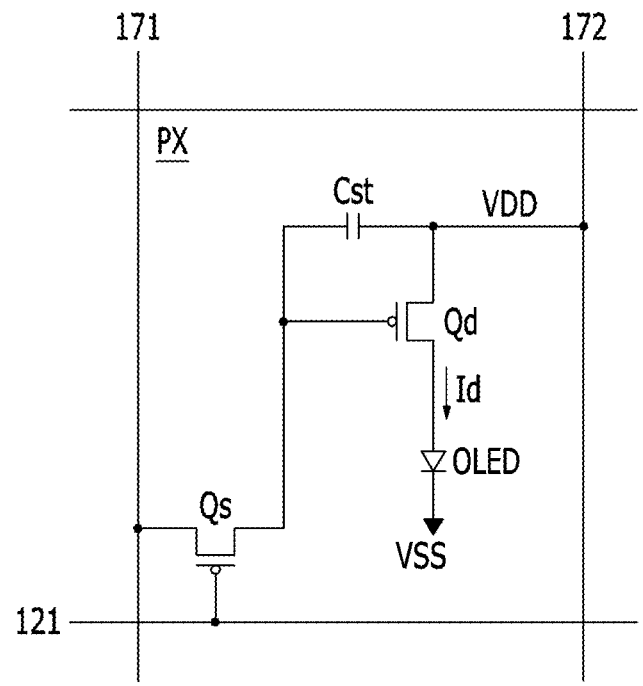
FIG. 2 is a circuit diagram of one pixel of an organic light emitting diode display according to an exemplary embodiment of the present invention.
Figure 3:
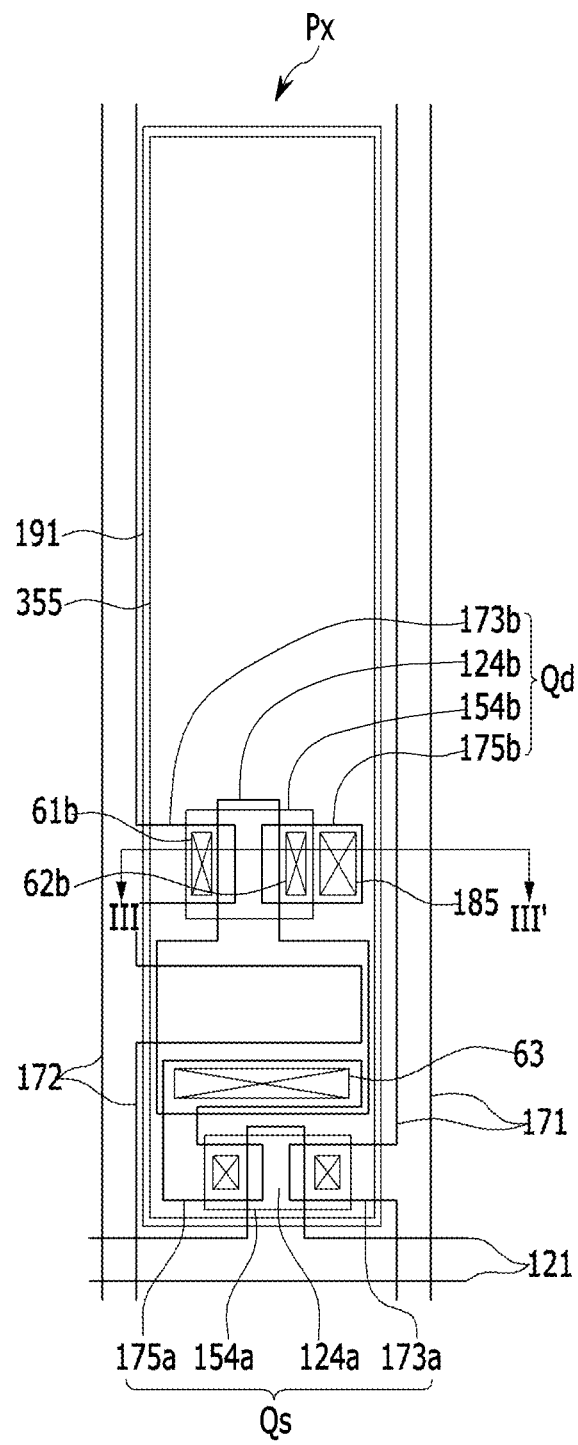
FIG. 3 is a layout view of one pixel of an organic light emitting diode display according to an exemplary embodiment of the present invention.
Figure 4:
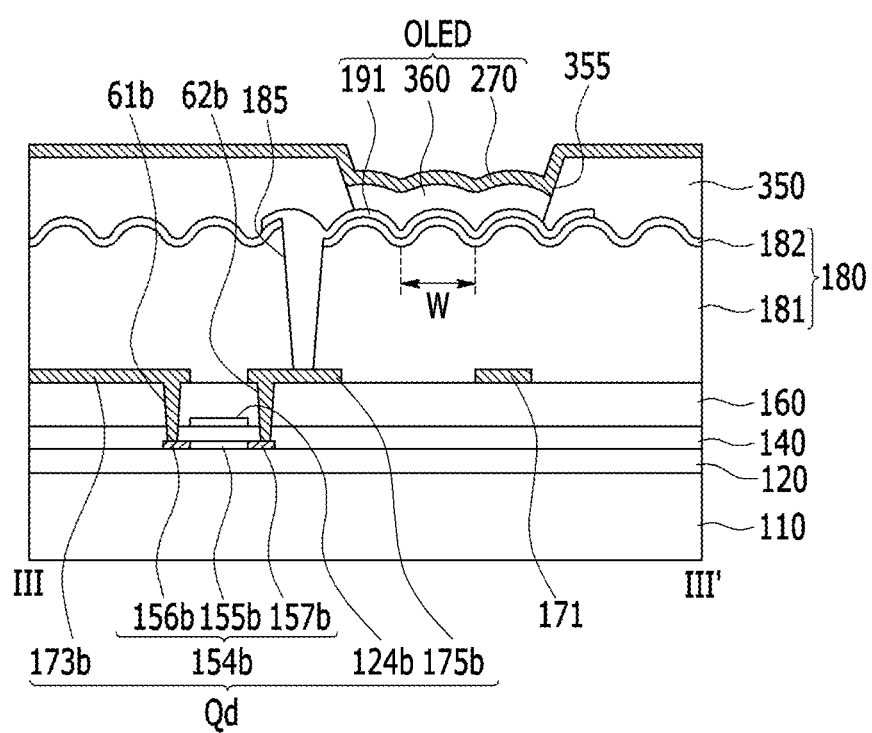
FIG. 4 is the cross-sectional view of the organic light emitting diode display of FIG. 3 taken along line III-III'.

Hereinafter, an OLED display manufactured by the above described method will be described in more detail. FIG. 2 is a circuit diagram of one pixel of an organic light emitting diode display according to an exemplary embodiment of the present invention. FIG. 3 is a layout view of one pixel of an organic light emitting diode display according to an exemplary embodiment of the present invention. FIG. 4 is a cross-sectional view of the organic light emitting diode display of FIG. 3 taken along line III-III'.

Referring to FIG. 2, the OLED display according to the present exemplary embodiment includes signal lines 121, 171, and 172 and a pixel PX arranged substantially in a matrix form. The signal lines include gate lines 121 transmitting a gate signal (or a scan signal), data lines 171 transmitting a data signal, and driving voltage lines 172 transmitting a driving voltage VDD. The gate lines 121 extend substantially in a row direction and are substantially parallel to each other. The data lines 171 and the driving voltage lines 172 extend substantially in a column direction and are substantially parallel to each other.

Each of the pixels PX includes a switching thin-film transistor Qs, a driving thin-film transistor Qd, a storage capacitor Cst, and an organic light emitting diode OLED. The switching thin-film transistor Qs includes a control terminal, an input terminal, and an output terminal. The control terminal is connected to the gate line 121, the input terminal is connected to the data line 171, and the output terminal is connected to the driving thin-film transistor Qd. The switching thin-film transistor Qs transmits the data signal applied to the data line 171 to the driving thin-film transistor Qd, in response to the gate signal applied to the scanning line 121.

The driving thin-film transistor Qd includes a control terminal, an input terminal, and an output terminal. The control terminal is connected to the switching thin-film transistor Qs, the input terminal is connected to the driving voltage line 172, and the output terminal is connected to the organic light emitting diode OLED. The driving thin-film transistor Qd applies an output current Id, in which the magnitude thereof varies according to the voltage applied between the control terminal and the output terminal.

The storage capacitor Cst is connected between the control terminal and the input terminal of the driving thin-film transistor Qd. The storage capacitor Cst charges the data signal, which is applied to the control terminal of the driving thin-film transistor Qd, and maintains the charged data signal even after the switching thin-film transistor Qs is turned off.

The organic light emitting element OLED includes an anode connected to the output terminal of the driving thin-film transistor Qd and a cathode connected to a common voltage Vss. The organic light emitting diode OLED emits light, in which the intensity thereof may vary depending on the output current Id from the driving thin-film transistor Qd, to display an image.

The switching thin-film transistor Qs and the driving thin-film transistor Qd may be n-channel field effect transistors (FET). Alternatively, at least one of the switching thin-film transistor Qs and the driving thin-film transistor Qd may be a p-channel FET. It is noted that, however, the connection configuration of the switching thin-film transistor Qs, the driving thin-film transistor Qd, the storage capacitor Cst, and the organic light emitting element OLED may be varied.

Referring to FIG. 3 and FIG. 4, the OLED display according to an exemplary embodiment of the present invention includes multiple thin-films disposed on a substrate 110.

The substrate 110 may include a hard material, such as a glass, a metal, or PVC, or a flexible material, such as polyimide (PI), polyethylene terephthalate (PET), polyether sulfone (PES), polyacrylate (PAR), polyetherimide (PEI), polyethylene naphthalate (PEN), polyethylene terephthalate (PET), polyphenylene sulfide (PPS), polyarylate (PA), or triacetyl cellulose (TAC). It is noted that, however, the substrate 110 may not be limited by physical properties thereof, such as a kind, a property, or a material.

A buffer layer 120 that may prevent penetration of impurities and planarize the surface may be disposed on the substrate 110. The buffer layer 120 may have a single layer or a multilayer structure of a dual layer or more. For example, the buffer layer 120 may include one of a silicon nitride ($SiN_x$) layer, a silicon oxide ($SiO_x$) layer, and a silicon oxynitride ($SiO_xN_y$) layer. Alternatively, the buffer layer 120 may be omitted according to a type of the substrate 110 and a process condition thereof.

Switching and driving semiconductor layers 154a and 154b spaced apart from each other are disposed on the buffer layer 120. The switching semiconductor layer 154a and the driving semiconductor layer 154b have substantially similar structures. Accordingly, the driving semiconductor layer 154b will be mainly described with reference to FIG. 4.

The driving semiconductor layer 154b may include a polycrystalline silicon. The driving semiconductor layer 154b includes a driving channel region 155b, a driving source region 156b, and a driving drain region 157b. The driving source region 156b and the driving drain region 157b are disposed on both sides of the driving channel region 155b. The driving channel region 155b may include a polycrystalline silicone, which is not doped with impurities (i.e., an intrinsic semiconductor). The driving source region 156b and the driving drain region 157b may include a polycrystalline silicon, which is doped with conductive impurities (i.e., an impurity semiconductor).

A gate insulating layer 140 is disposed on the buffer layer 120 and the driving semiconductor layer 154b. The gate insulating layer 140 may include at least one of tetraethyl orthosilicate (TEOS), silicon nitride, and silicon oxide, and may be a single layer or multiple layers.

A gate electrode 124b is disposed on the driving semiconductor layer 154b, and the gate electrode 124b overlaps the driving channel region 155b. The gate electrode 124b may be formed in a single layer or a multilayer, and include a low resistance material, such as aluminum (Al), titanium (Ti), molybdenum (Mo), copper (Cu), nickel (Ni), or an alloy thereof, or a material having strong corrosion resistance.

A first interlayer insulating layer 160 is disposed on the gate electrode 124b. The first interlayer insulating layer 160 may be formed in a single layer or a multilayer, and may include at least one of tetraethyl orthosilicate (TEOS), silicon nitride, silicon oxide, or the like. A source contact hole 61b and a drain contact hole 62b exposing the driving source region 156b and the driving drain region 157b, respectively, are formed in the first interlayer insulating layer 160 and the gate insulating layer 140. A data line 171, a source electrode 173b, and a drain electrode 175b are disposed on the first interlayer insulating layer 160. The data lines 171 transmit a data signal and extend in a crossing direction of the gate lines 121. The data lines 171 include a switching source electrode 173a protruding towards the switching semiconductor layer 154a from the data lines 171.

The source electrode 173b is connected to the driving source region 156b through the source contact hole 61b, and the drain electrode 175b is connected to the driving drain region 157b through the drain contact hole 62b. The source electrode 173b and the drain electrode 175b may be formed in a single layer or a multilayer, and include a low resistance material, such as Al, Ti, Mo, Cu, Ni, or an alloy thereof, or the material having strong corrosion resistance. For example, the source electrode 173b and the drain electrode 175b may be a triple layer of Ti/Cu/Ti, Ti/Ag/Ti, or Mo/Al/Mo. The driving semiconductor layer 154b, the gate electrode 124b, the source electrode 173b, and the drain electrode 175b form the driving thin-film transistor Qd.

A protection layer 180 is disposed on the source electrode 173b and the drain electrode 175b. The protection layer 180 may include a first protection layer 181 a second protection layer 182, on which a wrinkle is formed on the surface thereof. The protection layer 180 includes a contact hole 185 exposing the drain electrode 175b.

In general, a color shift may occur in an OLED display having a resonance structure, of which some color is recognized as a different color, as a viewing angle of an observer is moved from a front to a side of the display device. This is because the resonance condition of light is changed in accordance with the viewing angle. That is, a clear full color screen may be well realized in the front of the OLED display, however, as the viewing angle is moved from the front to the lateral side, some colors emitted in the lateral portion thereof may be changed into a different color, which may deteriorate display quality due to the color shift. For example, a white color may appear in front of the OLED display, however, a bluish phenomenon, which the white color appears as a bluish color, may occur in the lateral side thereof.

In an OLED display according to exemplary embodiments of the present invention, since the wrinkle is formed on the surface of the protection layer, a display element layer disposed thereon has the wrinkle structure, such that a change of a white angle dependency (WAD) in accordance to the viewing angle may be reduced, which may improve display quality.

According to an exemplary embodiment of the present invention, a modulus value of the first protection layer 181 is less than that of the second protection layer 182 by at least about 300 MPa, about 400 MPa, or more preferably about 500 MPa. When the modulus of the first protection layer 181 does not have the modulus value smaller than that of the second protection layer 182 by at least, for example, 300 MPa, it may be difficult to form the wrinkle on the surface of the protection layer by the deposition process.

The first protection layer 181 may include hexamethyldisiloxane (HMDSO). The modulus value of hexamethyldisiloxane (HMDSO) may be variously controlled through the deposition process. Accordingly, the modulus value of the hexamethyldisiloxane (HMDSO) may be controlled during the deposition process, such that the first protection layer including the hexamethyldisiloxane (HMDSO) may have a modulus value less than a modulus value of a second protection layer by at least about 300 MPa. In this manner, a wrinkle may be formed on the surface of the protection layer by the deposition process.

The second protection layer 182 may include at least one of $SiN_x$, $SiO_xN_y$, $SiO_x$, SiCN, SiOCN, and combinations thereof. When forming the first protection layer 181 and the second protection layer 182 by using the material of the above-described materials, the modulus difference between the first and second protection layers 181 and 182 may be easily controlled.

The thickness of the first protection layer 181 may be in a range of 2000 Å to 8000 Å, and the thickness of the second protection layer 182 may be in a range of 1000 Å to 3000 Å. According to an exemplary embodiment of the present invention, the first protection layer 181 may be formed to have a smaller modulus value than a modulus value of the second protection layer 182 by at least 300 MPa, by controlling the thicknesses of the first protection layer 181 and the second protection layer 182.

As described above, since the protection layer 180 according to the present exemplary embodiment is formed with a wrinkle on the surface thereof, the emission efficiency of the organic light emitting element disposed thereon may be increased and the color shift phenomenon may be significantly reduced.

Figure 5:
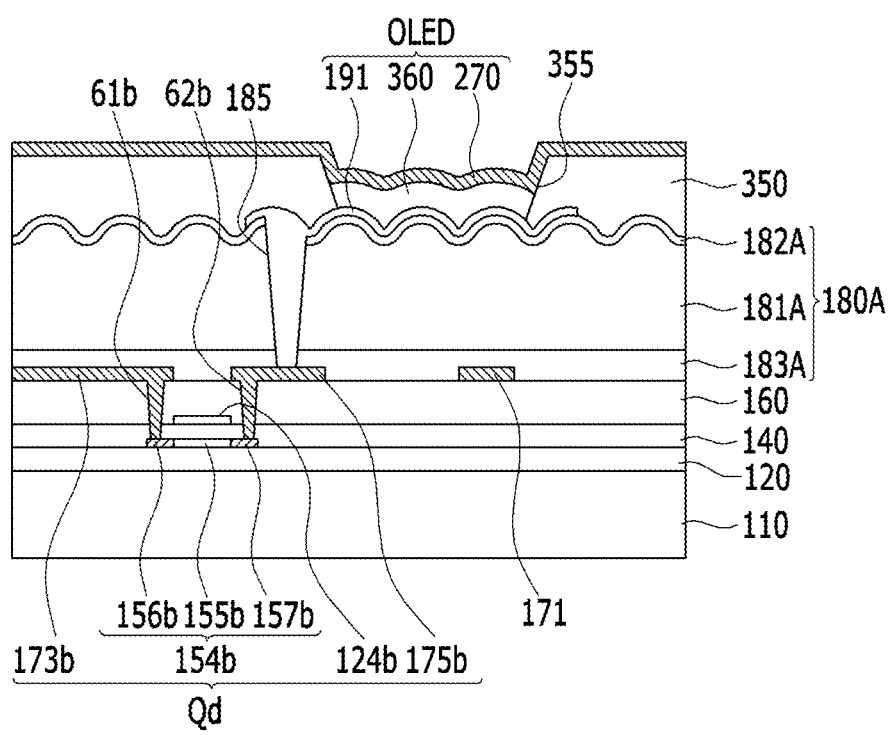
FIG. 5, FIG. 6, and FIG. 7 are cross-sectional views of an organic light emitting diode display according to exemplary embodiments of the present invention.
Figure 6:
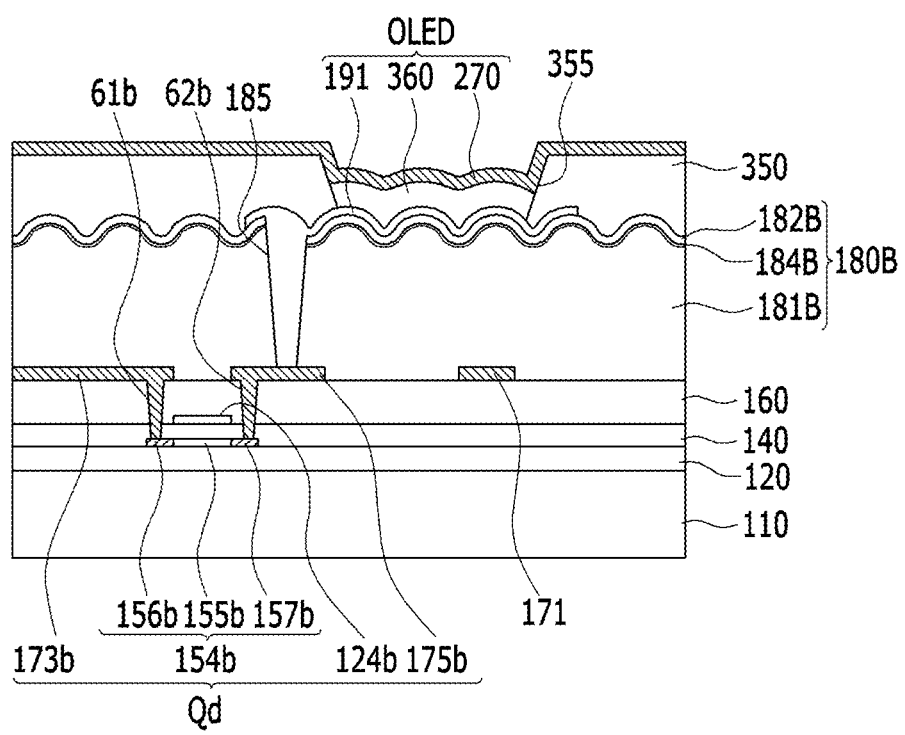
Figure 7:
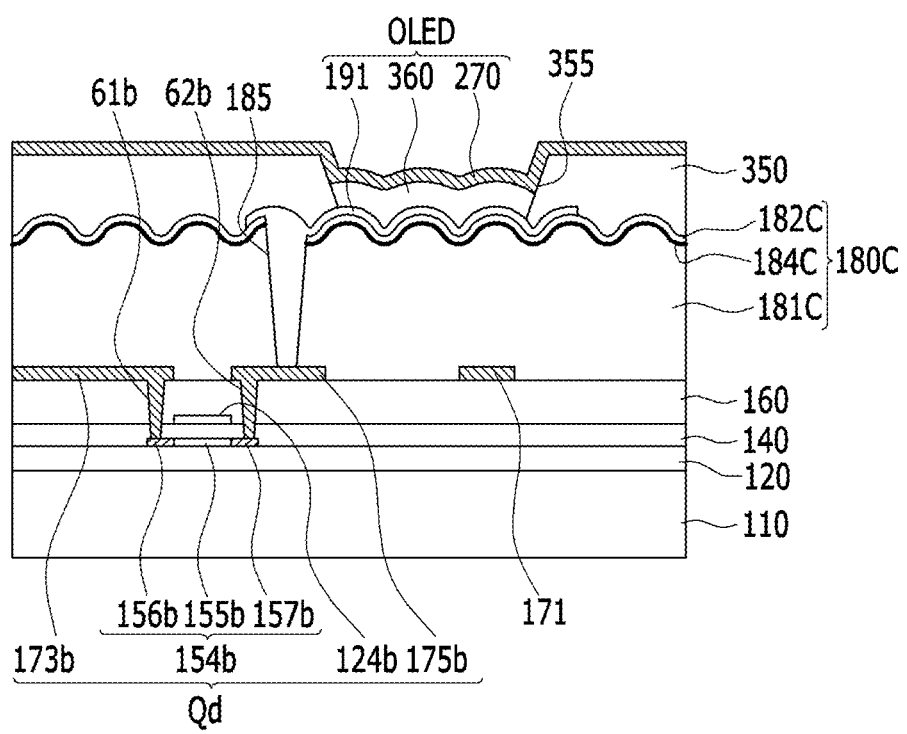

FIG. 5 to FIG. 7 are cross-sectional views of an OLED display according to exemplary embodiments of the present invention.

Referring to FIG. 5, a protection layer 180A may include a first protection layer 181A, a second protection layer 182A, and a third protection layer 183A. The third protection layer 183A is disposed on a first interlayer insulating layer 160 to cover a driving thin-film transistor Td. The first protection layer 181A and the second protection layer 182A may be substantially similar to the first protection layer 181 and the second protection layer 182 illustrated with reference to FIG. 4, and, thus, repeated description thereof will be omitted.

The third protection layer 183A may include the same material as the second protection layer 182A, which may be at least one of $SiN_x$, $SiO_xN_y$, $SiO_x$, SiCN, SiOCN, and combinations thereof. When the protection layer 180A further includes the third protection layer 183A, the thin-film transistor may be effectively protected.

Referring to FIG. 6, a protection layer 180B may include a first protection layer 181B, a second protection layer 182B, and a fourth protection layer 184B disposed between a first protection layer 181B and a second protection layer 182B. The first protection layer 181B and the second protection layer 182B may be substantially similar to the first protection layer 181 and the second protection layer 182 illustrated with reference to FIG. 4, and, thus, repeated description thereof will be omitted.

The fourth protection layer 184B may be formed to have a modulus value greater than the modulus of the first protection layer 181B by about 100 MPa to 200 MPa. For example, the hardened hexamethyldisiloxane (HMDSO) may be utilized to form the fourth protection layer 184B. More particularly, the fourth protection layer 184B having the relatively greater modulus value is disposed on the surface of the first protection layer 181B, and the second protection layer 182B having the greater modulus value than the fourth protection layer 184B, by at least 100 MPa, is disposed on the fourth protection layer 184B. In this manner, the width and the interval of the wrinkle formed on the surface of the protection layer 180B may be easily controlled.

Referring to FIG. 7, a top surface of a first protection layer 181C of a protection layer 180C may be subjected to the surface treatment, by using a gas such as hydrogen, so as to have a relatively greater modulus value than an inner portion of the first protection layer 181C.

The second protection layer 182C may be disposed on the surface-treated portion 184C of the first protection layer 181C. In this manner, since the modulus value of the top surface (i.e., 184C) of the first protection layer 181C may be greater than inside thereof, the wrinkle of the surface of the protection layer 180C may be easily formed, when depositing the second protection layer 182C. The first protection layer 181C and the second protection layer 182C may be substantially similar to the first protection layer 181 and the second protection layer 182 illustrated with reference to FIG. 4, and, thus, repeated description thereof will be omitted.

Referring to FIG. 4 to FIG. 7, an average width W of the wrinkle formed on the surface of the protection layers 180, 180A, 180B, and 180C of the OLED display according to exemplary embodiments of the present invention may be in the range of 300 nm to 1500 nm. As used herein, referring back to FIG. 4, the average width W of the wrinkle may refer to the average value of a maximum width of the protruded portion in the cross-sectional shape of the wrinkle, which includes alternately arranged protruded portion and depressed portion, or the average value of the distance between the lowest point of one depressed portion and the lowest point of the depressed portion adjacent thereto.

According to exemplary embodiments of the present invention, the average width W of the wrinkle formed on the surface of each of the protection layers 180, 180A, 180B, and 180C may be controlled to reduce the color shift phenomenon, which depends on the lateral viewing angle, according to the color emitted from the organic emission layer.

An organic light emitting diode OLED and a pixel definition layer 350 are disposed on each of the protection layers 180, 180A, 180B, and 180C. The organic light emitting diode OLED includes a pixel electrode 191, an organic emission layer 360, and a common electrode 270. The pixel electrode 191 and the common electrode 270 may be formed in plural. One of the pixel electrode 191 and the common electrode 270 may be an anode electrode, which functions as a hole injection electrode, and the other one may be a cathode electrode, which functions as an electrode injection electrode.

The pixel electrode 191 is disposed on each of the protection layers 180, 180A, 180B, and 180C, and is physically and electrically connected to the drain electrode 175b of the driving thin-film transistor Qd through the contact hole 185 formed in each of the protection layers 180, 180A, 180B, and 180C. The pixel electrode 191 receives an electrical signal from the drain electrode 175b to transmit the electron or the hole to the organic emission layer 360, to operate the OLED display. Accordingly, the OLED according to the exemplary embodiments of the present invention includes pixel electrodes 191 respectively disposed in pixels PX. The pixel electrodes 191 are spaced apart from each other.

The pixel definition layer 350 formed with the opening exposing the pixel electrode 191 is disposed on each of the protection layers 180, 180A, 180B, and 180C. The openings respectively corresponding to each pixel is formed in the pixel definition layer 350, and the openings of the pixel definition layer 350 exposing the pixel electrodes 191 may define a region of each pixel PX. In this case, the pixel electrode 191 is disposed to correspond to the opening of the pixel definition layer 350. It is noted that, however, a portion of the pixel electrode 191 may be disposed under the pixel definition layer 350 to be overlapped by the pixel definition layer 350.

The organic emission layer 360 may be disposed on the pixel electrode 191, and disposed in the opening 355 of the pixel definition layer 350. The organic emission layer 360 may be formed of a multilayer including an emission layer, and may include one or more of an emission layer, a hole-injection layer (HIL), a hole-transporting layer (HTL), an electron-transporting layer (ETL), and an electron-injection layer (EIL). When the organic emission layer 360 includes all of them, the hole-injection layer is disposed on the pixel electrode 191 as an anode, and the hole-transporting layer, the emission layer, the electron-transporting layer, and the electron-injection layer may be sequentially laminated thereon. The organic emission layer 360 may include a low-molecular organic material or a high-molecular organic material such as poly(3,4-ethylenedioxythiophene) (PEDOT).

The organic emission layer 360 may be at least one of a red organic emission layer emitting red, a blue organic emission layer emitting blue, and a green organic emission layer emitting green. The red organic emission layer, the blue organic emission layer, and the green organic emission layer are respectively formed in the red pixel, the green pixel, and the blue pixel, thereby realizing a color image. In this case, the average width W of the wrinkle formed on the surface of each of the protection layers 180, 180A, 180B, and 180C is controlled in accordance with the color emitted from the organic emission layer 360 as described above, thereby realizing the display device representing an excellent display quality.

The organic emission layer 360 may implement color images by stacking the red organic emission layer, the green organic emission layer, and the blue organic emission layer in all of the red pixel, the green pixel, and the blue pixel, and forming a red color filter, a green color filter, and a blue color filter for respective pixels.

As another example, white organic emission layers emitting white light may be disposed in the red pixel, the green pixel, and the blue pixel, and a red color filter, a green color filter, and a blue color filter are formed for respective pixels, thereby implementing the color image. When implementing the color image by using the white organic emission layer and the color filters, a deposition mask for depositing the red organic emission layer, the green organic emission layer, and the blue organic emission layer on respective pixels, that is, the red pixel, the green pixel, and the blue pixel, may not be utilized.

The white organic emission layer may be formed by one organic emission layer, and may have a configuration in which organic emission layers are laminated so as to emit white light. For example, the white organic emission layer may have a configuration that may emit white light by combining at least one yellow organic emission layer and at least one blue organic emission layer, at least one cyan organic emission layer and at least one red organic emission layer, and/or at least one magenta organic emission layer and at least one green organic emission layer, and the like.

The common electrode 270 may be disposed on the organic emission layer 360. In this manner, the organic light emitting diode OLED including the pixel electrode 191, the organic emission layer 360, and the common electrode 270 is formed. In this case, the pixel electrode 191 and the common electrode 270 may include a transparent conductive material or a transflective or reflective conductive material. More particularly, the reflective conductive material, for example, may include lithium (Li), calcium (Ca), lithium fluoride/calcium (LiF/Ca), lithium fluoride/aluminum (LiF/Al), aluminum (Al), silver (Ag), magnesium (Mg), or gold (Au). According to the type of materials forming the pixel electrode 191 and the common electrode 270, the organic light emitting diode device may be a top emission type, a bottom emission type, or a double-sided emission type.

According to exemplary embodiments of the present invention, the common electrode 270 disposed on the pixel electrode 191, the organic emission layer 360, and the common electrode 270 are formed on each of the protection layers 180, 180A, 180B, and 180C, in which the surface thereof are formed with the wrinkle, such that the surface of the common electrode 270 is formed to have the substantially similar wrinkle as the protection layers 180, 180A, 180B, and 180C.

Accordingly, the OLED display according to the exemplary embodiments of the present invention includes the protection layer 180, 180A, 180B, or 180C formed with the wrinkle, and the display element layer is disposed thereon, which may significantly reduce the change of the white angle dependency (WAD) or a wide angle distribution (WAD) depending on the viewing angle.

Hereinafter, exemplary embodiments of the present invention will be described in detail with reference to FIGS. 8 to 15.

Figure 8:
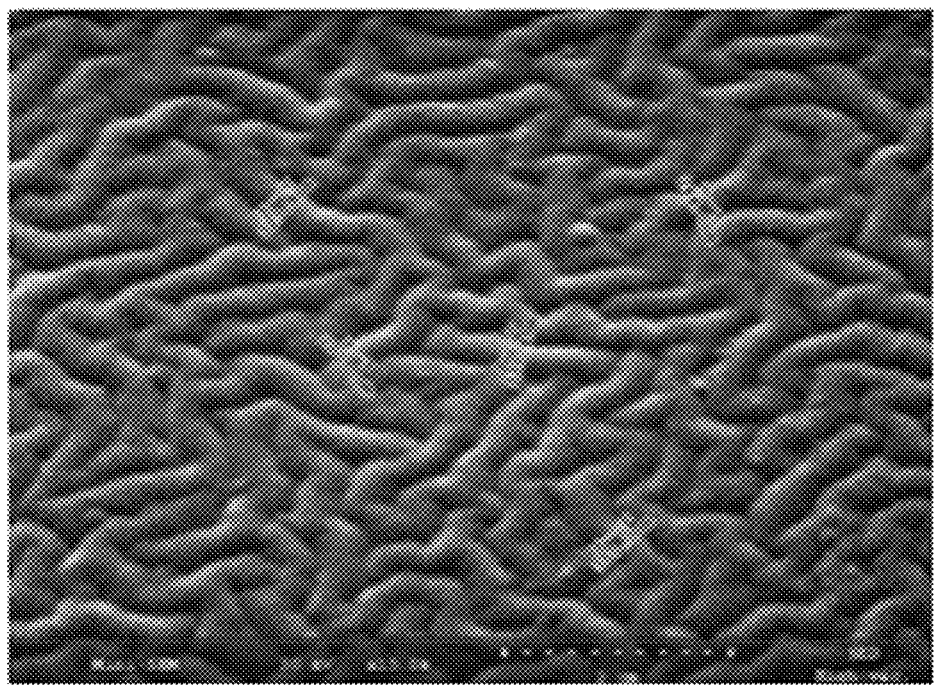
FIG. 8, FIG. 9, FIG. 10, FIG. 11, FIG. 12, FIG. 13, FIG. 14, and FIG. 15 are plan focused ion beam (FIB) photos illustrating a protection layer according to exemplary embodiments of the present invention.

According to an exemplary embodiment of the present invention, with reference to FIG. 4 and FIG. 8, the HMDSO is deposited with the thickness of 2000 Å by using the chemical vapor deposition method on the substrate formed with the thin-film transistor, to form the first protection layer. In this case, the deposition condition is controlled such that the first protection layer has a smaller modulus value than that of $SiN_x$, which will be disposed on the first protection layer, by about 300 MPa or more. $SiN_x$ is deposited with the thickness of 2000 Å on the first protection layer to form the second protection layer.

Figure 9:
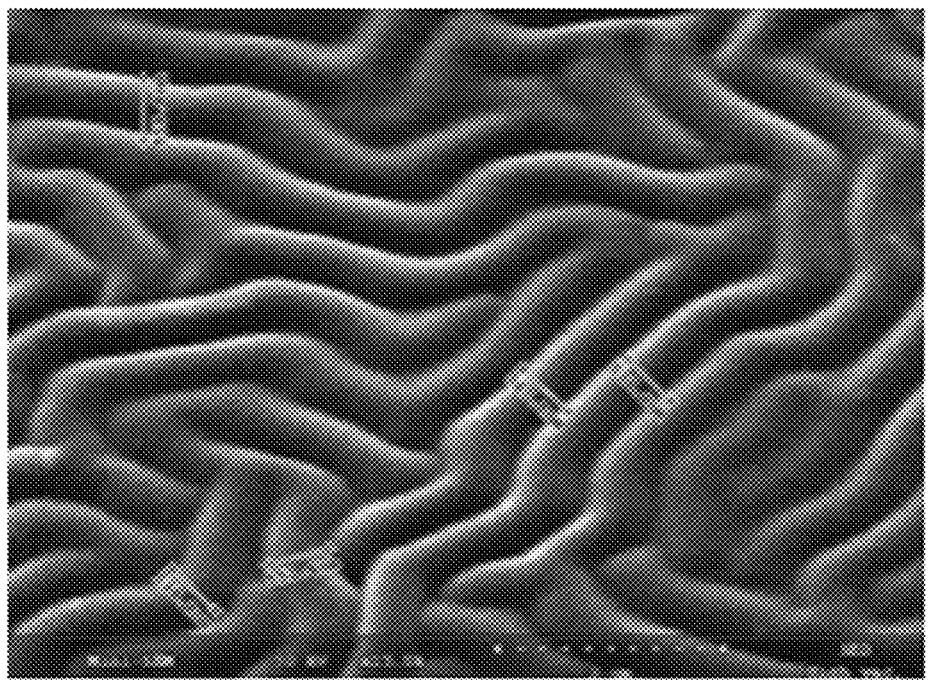

According to an exemplary embodiment of the present invention, with reference to FIG. 4 and FIG. 9, the first protection layer and the second protection layer are formed by the same method as those described with reference to FIG. 4 and FIG. 8, except for depositing the $SiN_x$ to have the thickness of 1000 Å.

Figure 10:
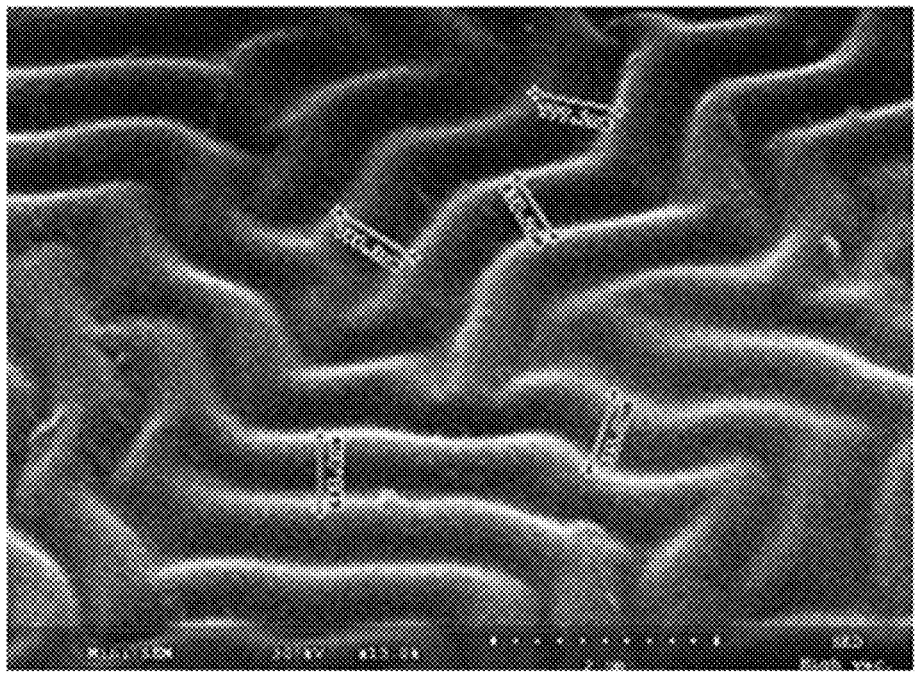

According to an exemplary embodiment of the present invention, with reference to FIG. 4 and FIG. 10, the first protection layer and the second protection layer are formed by the same method as those described with reference to FIG. 4 and FIG. 8, except for the HMDSO has the thickness of 4000 Å and $SiN_x$ has the thickness of 2000 Å.

Figure 11:
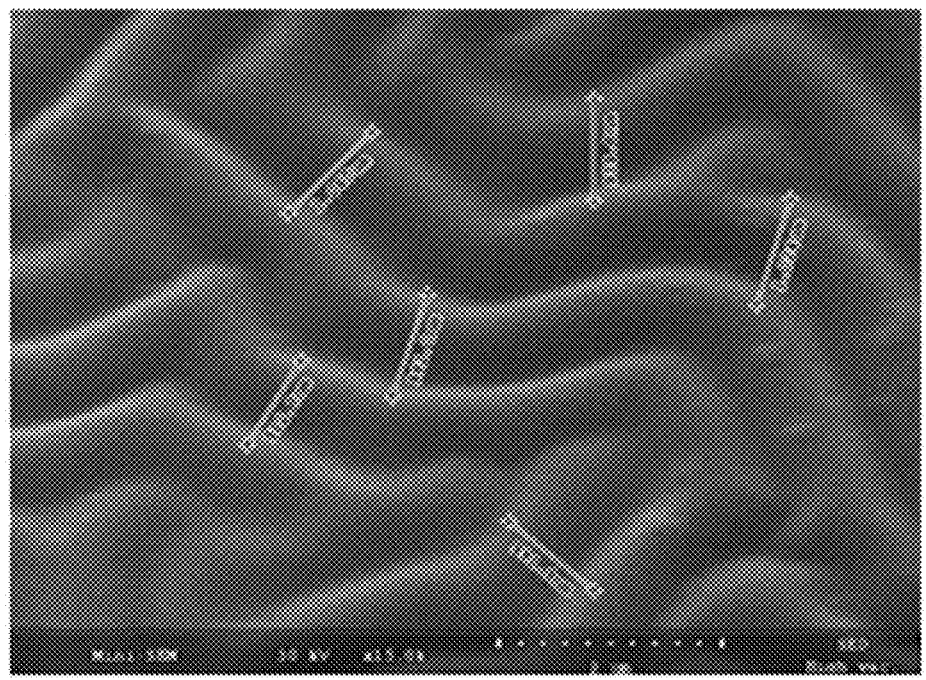

According to an exemplary embodiment of the present invention, with reference to FIG. 6 and FIG. 11, the HMDSO is deposited to have the thickness of 4000 Å, by using the chemical vapor deposition method on the substrate formed with the thin-film transistor, to form the first protection layer. In this case, the deposition condition is controlled such that the first protection layer has a smaller modulus value than that of $SiN_x$, which will be disposed thereon, by about 300 MPa or more. A hardened HMDSO is deposited with the thickness of 1000 Å on the first protection layer, to form the fourth protection layer. In this case, the hardening condition is controlled, such that the fourth protection layer has a greater modulus value than the first protection layer, by about 100 MPa to 200 MPa. $SiN_x$ is deposited with the thickness of 2000 Å on the fourth protection layer, to form the second protection layer.

Figure 12:
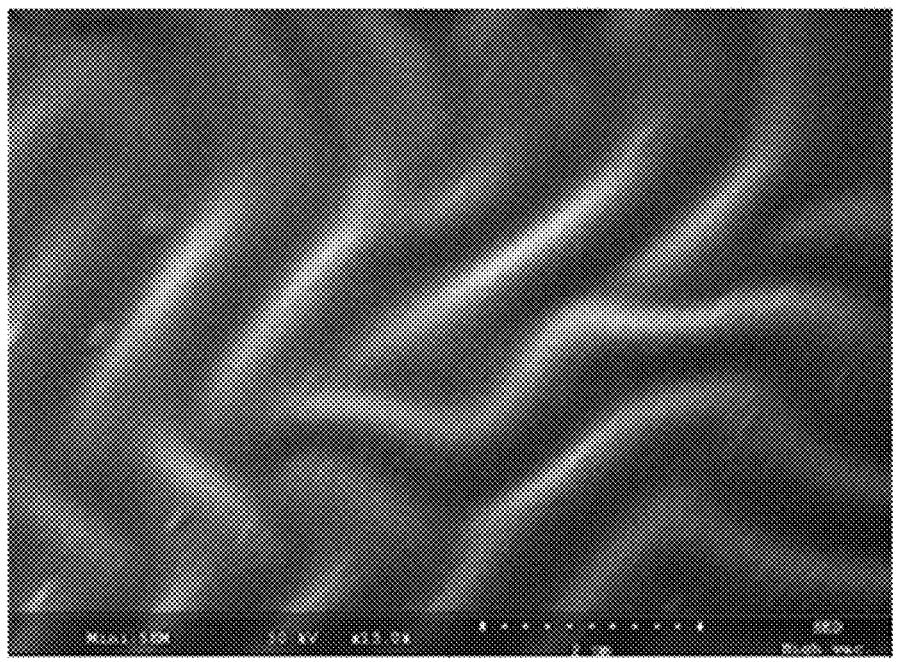

According to an exemplary embodiment of the present invention, with reference to FIG. 7 and FIG. 12, the HMDSO is deposited with the thickness of 4000 Å by using the chemical vapor deposition method on the substrate formed with the thin-film transistor, to form the first protection layer. In this case, the deposition condition is controlled such that the modulus value of the first protection layer is less than that of the $SiN_x$, which will be disposed thereon, by about 300 MPa or more.

Next, the first protection layer is subjected to a plasma surface treatment using hydrogen gas for 10 seconds. Next, $SiN_x$ is deposited with the thickness of 2000 Å on the surface treated first protection layer, to form the second protection layer.

Figure 13:
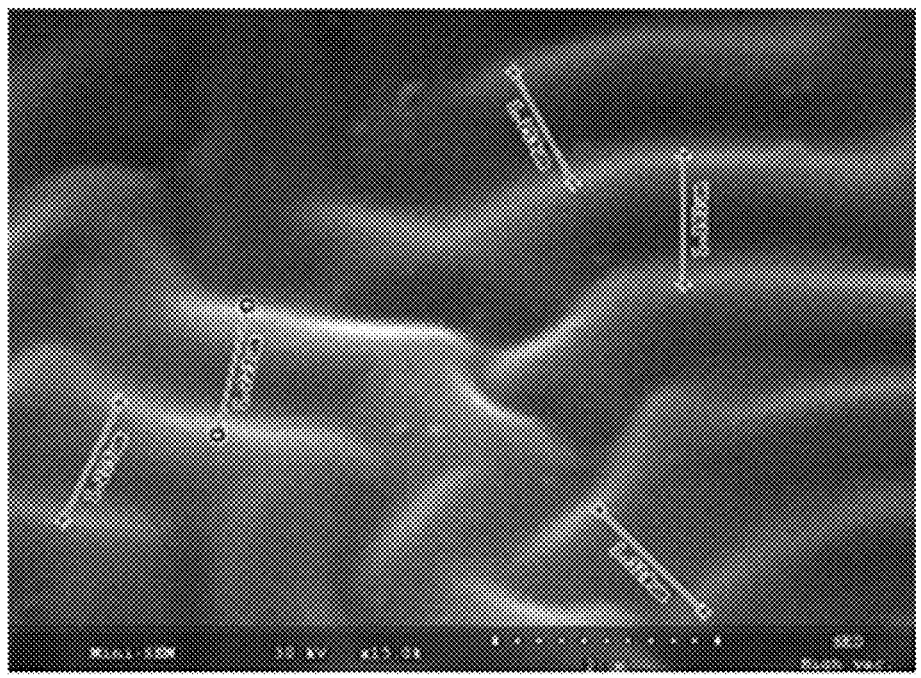

According to an exemplary embodiment of the present invention, with reference to FIG. 6 and FIG. 13, the first protection layer, the fourth protection layer, and the second protection layer are formed by the same method as those illustrated with reference to FIG. 6 and FIG. 11, except for the deposition thickness of the HMDSO forming the first protection layer has the thickness of 6000 Å.

Figure 14:
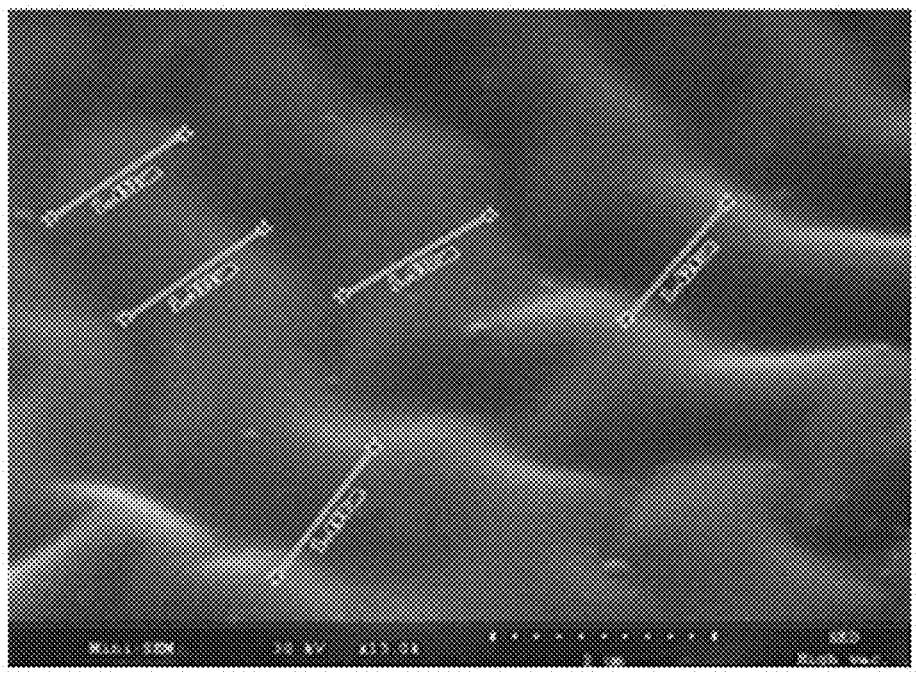

According to an exemplary embodiment of the present invention, with reference to FIG. 6 and FIG. 14, the first protection layer, the fourth protection layer, and the second protection layer are formed by the same method as those illustrated with reference to FIG. 6 and FIG. 11, except for the deposition thickness of the HMDSO forming the first protection layer is 8000 Å.

According to an exemplary embodiment of the present invention, with reference to FIG. 7 and FIG. 14, the first protection layer and the second protection layer are formed by the same method as those illustrated with reference to FIG. 7 and FIG. 12, except for the deposition thickness of the HMDSO forming the first protection layer is 8000 Å and the plasma surface treatment for 20 seconds.

Figure 15:
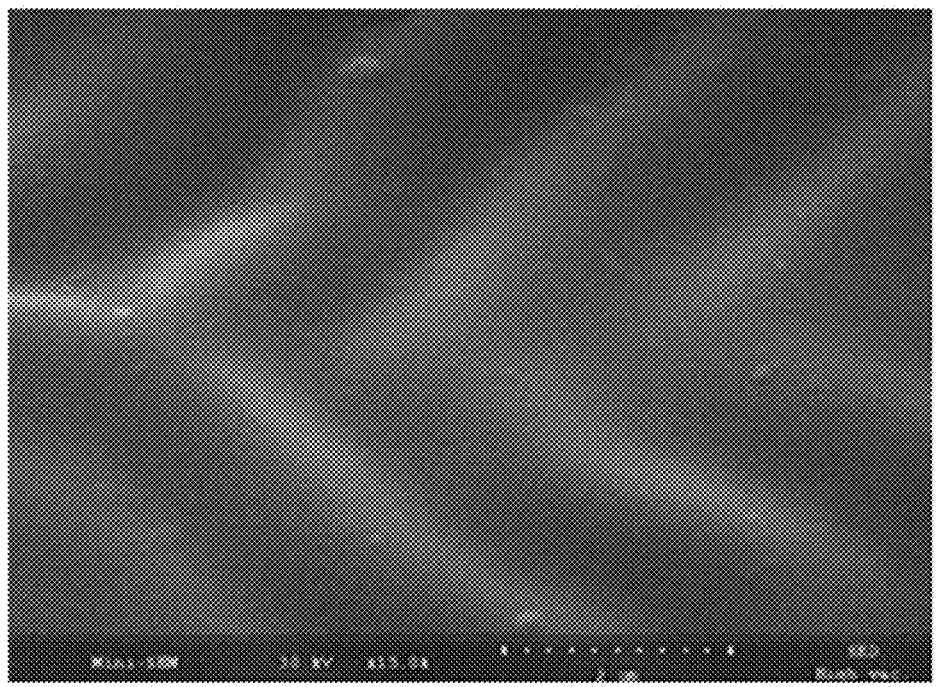

According to a comparative embodiment, with reference to FIG. 15, the first protection layer and the second protection layer are formed by the same method those illustrated with reference to FIG. 4 and FIG. 8, except for controlling the deposition condition, such that the modulus value of the first protection layer is less than that of the second protection layer, for example $SiN_x$, by about 150 MPa or less for the HMDSO.

FIGS. 8 to 16 respectively illustrate an OLED display according to the exemplary embodiments of the present invention and the comparative embodiment, taken by using a focused ion beam (FIB). Referring to FIG. 8 to FIG. 15, it may be confirmed that when the first protection layer is formed to have a smaller modulus value than the second protection layer by at least 300 MPa, the wrinkle is formed on the surface of the first protection layer with various average widths. Accordingly, when the first protection layer has the modulus value smaller than the second protection layer by at least 300 MPa, the protection layer having the surface formed with the wrinkle may be easily formed by a deposition process.

Figure 16:
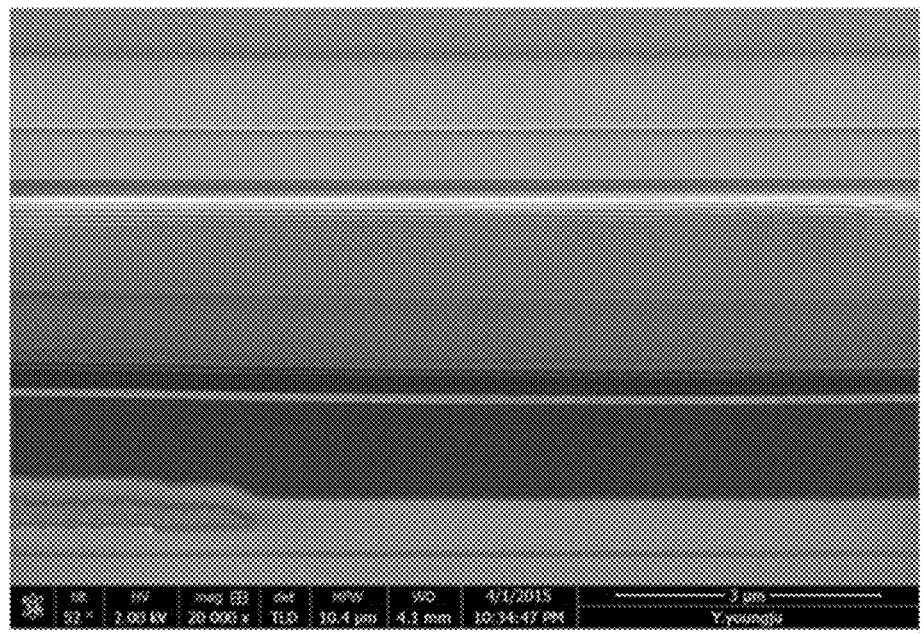
FIG. 16 is a plan FIB photo illustrating a protection layer according to a comparative embodiment.

Referring to FIG. 16, when the first protection layer has a smaller modulus value than the second protection layer by about 150 MPa, it may be confirmed that the cross-sectional structure is flat. Accordingly, although the deposition process is performed by utilizing the same material, when the modulus value of the first protection layer is not smaller than the second protection layer by at least 300 MPa, the wrinkle may not be formed.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A method for manufacturing an organic light emitting diode display, the method comprising:
   forming a thin-film transistor on a substrate;
   forming a protection layer by using a deposition method on an entire surface of the substrate, comprising:
      forming a first protection layer having a first modulus value; and
      forming a second protection layer on the first protection layer, the second protection layer having a second modulus value greater than the first modulus value by at least 300 MPa to form a wrinkle on a surface of each of the first and second protection layers; and
   forming an organic light emitting element on the protection layer.

2. The method of claim 1, wherein the deposition method is a chemical vapor deposition method.

3. The method of claim 1, wherein forming the protection layer further comprises:
   forming a third protection layer before forming the first protection layer.

4. The method of claim 1, wherein:
   forming the protection layer further comprises forming a fourth protection layer on the first protection layer, a surface thereof comprising a fourth wrinkle; and
   a fourth modulus value of the fourth protection layer is greater the first modulus value by about 100 MPa to 200 MPa.

5. The method of claim 1, wherein forming the protection layer further comprises:
   surface-treating the first protection layer after forming the first protection layer.

6. The method of claim 5, wherein the surface treatment comprises using at least one of $H_2$, $N_2$, $N_2O$, and combinations thereof.

7. An organic light emitting diode display, comprising:
   a thin-film transistor disposed on a substrate;
   a protection layer disposed on the thin-film transistor, the protection layer comprising:
      a first protection layer, a surface thereof comprising a first wrinkle; and
      a second protection layer disposed on the first protection layer, a surface thereof comprising a second wrinkle;
   a first electrode disposed on the protection layer and electrically connected to the thin-film transistor;
   an organic emission layer disposed on the first electrode; and
   a second electrode disposed on the organic emission layer,
   wherein a first modulus value of the first protection layer is less than a second modulus value of the second protection layer by at least 300 MPa.

8. The organic light emitting diode display of claim 7, wherein the first protection layer comprises hexamethyldisiloxane (HMDSO).

9. The organic light emitting diode display of claim 7, wherein the second protection layer comprises at least one of silicon nitride ($SiN_x$), silicon oxynitride ($SiO_xN_y$), silicon oxide ($SiO_x$), silicon carbonitride (SiCN), silicon oxy carbonitride (SiOCN), and combinations thereof.

10. The organic light emitting diode display of claim 7, wherein the thickness of the first protection layer is in a range of 2000 Å to 8000 Å.

11. The organic light emitting diode display of claim 7, wherein the thickness of the second protection layer is in a range of 1000 Å to 3000 Å.

12. The organic light emitting diode display of claim 7, wherein the first protection layer further comprises a third protection layer, the third protection layer being disposed between the thin-film transistor and the first protection layer.

13. The organic light emitting diode display of claim 12, wherein the third protection layer comprises at least one of silicon nitride ($SiN_x$), silicon oxynitride ($SiO_xN_y$), silicon oxide ($SiO_x$), silicon carbonitride (SiCN), silicon oxy carbonitride (SiOCN), and combinations thereof.

14. The organic light emitting diode display of claim 7, further comprising:
   a fourth protection layer disposed between the first protection layer and the second protection layer,
   wherein a fourth modulus value of the fourth protection layer is greater than the first modulus value by 100 MPa to 200 MPa.

15. The organic light emitting diode display of claim 7, wherein an average width of the first wrinkle or the second wrinkle is in a range of 300 nm to 1500 nm.

16. A method for manufacturing an organic light emitting diode display, the method comprising:
   forming a thin-film transistor on a substrate;
   forming a protection layer by using a deposition method on an entire surface of the substrate, comprising:
      forming a first protection layer, a surface thereof comprising a first wrinkle;
      forming a second protection layer on the first protection layer, a surface thereof comprising a second wrinkle; and forming a third protection layer on the second protection layer, a surface thereof comprising a third wrinkle; and forming an organic light emitting element on the protection layer.

* * * * *